(12) United States Patent
Priewasser

(10) Patent No.: US 8,815,644 B2
(45) Date of Patent: Aug. 26, 2014

(54) WAFER PROCESSING METHOD

(71) Applicant: Disco Corporation, Tokyo (JP)

(72) Inventor: Karl Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/870,490

(22) Filed: Apr. 25, 2013

(65) Prior Publication Data

US 2013/0302969 A1    Nov. 14, 2013

(30) Foreign Application Priority Data

May 8, 2012    (JP) ................... 2012-106940

(51) Int. Cl.
| | | |
|---|---|---|
| H01L 21/00 | (2006.01) | |
| H01L 21/683 | (2006.01) | |
| H01L 21/78 | (2006.01) | |
| H01L 21/82 | (2006.01) | |
| H01L 21/67 | (2006.01) | |
| B81C 1/00 | (2006.01) | |

(52) U.S. Cl.
CPC ........ *H01L 21/6836* (2013.01); *H01L 21/7806* (2013.01); *H01L 21/82* (2013.01); *H01L 21/67132* (2013.01); *B81C 1/0088* (2013.01)
USPC .......................................... 438/114; 438/464

(58) Field of Classification Search
CPC . H01L 21/6836; H01L 21/7806; H01L 21/82; H01L 21/67132; B81C 1/0088
See application file for complete search history.

(56) References Cited

U.S. PATENT DOCUMENTS

| | | | | |
|---|---|---|---|---|
| 5,882,956 | A * | 3/1999 | Umehara et al. .............. | 438/114 |
| 2005/0260829 | A1* | 11/2005 | Uematsu et al. .............. | 438/460 |
| 2007/0105348 | A1* | 5/2007 | Sekiya .......................... | 438/464 |
| 2007/0249145 | A1* | 10/2007 | Nakamura .................... | 438/464 |
| 2009/0124063 | A1* | 5/2009 | Nakamura .................... | 438/463 |
| 2009/0280622 | A1* | 11/2009 | Genda et al. .................. | 438/462 |
| 2009/0298219 | A1* | 12/2009 | Ohmoto et al. ................ | 438/66 |
| 2009/0298264 | A1* | 12/2009 | Arai et al. ..................... | 438/464 |
| 2011/0097875 | A1* | 4/2011 | Gokita et al. ................. | 438/462 |
| 2012/0061805 | A1* | 3/2012 | Amano et al. ................ | 257/622 |
| 2012/0088354 | A1* | 4/2012 | Furuta ........................... | 438/463 |
| 2012/0289028 | A1* | 11/2012 | Abatake ........................ | 438/463 |

FOREIGN PATENT DOCUMENTS

| | | |
|---|---|---|
| JP | 2006-140341 | 6/2006 |
| JP | 2010174067 A * | 8/2010 |

* cited by examiner

*Primary Examiner* — Alonzo Chambliss
(74) *Attorney, Agent, or Firm* — Greer Burns & Crain, Ltd

(57) ABSTRACT

A wafer processing method for processing a wafer having a device area and a peripheral marginal area surrounding the device area. The method includes: (i) attaching an adhesive tape having an annular adhesive layer only in a peripheral area thereof to the front side of the wafer, whereby the front side of the wafer is fully covered with the adhesive tape and the annular adhesive layer is positioned to correspond to the peripheral marginal area of the wafer, without the annular adhesive layer making contact with the device area; (ii) applying a laser beam to the wafer along division lines to thereby form a plurality of modified layers inside the wafer; (iii) attaching a protective tape to the back side of the wafer and peeling the adhesive tape from the front side of the wafer; and (iv) applying an external force to the wafer to divide the wafer.

3 Claims, 6 Drawing Sheets

WAFER PROCESSING METHOD

BACKGROUND OF THE INVENTION

1. Field of the Invention

The present invention relates to a wafer processing method for dividing a wafer having a microstructure on the front side thereof, and more particularly to a wafer processing method for dividing a MEMS wafer or a CMOS wafer.

2. Description of the Related Art

A wafer having a plurality of MEMS (Micro Electro Mechanical Systems) devices formed on the front side thereof is divided along a plurality of crossing division lines for partitioning these MEMS devices, thereby obtaining a plurality of individual device chips. In the case that such a MEMS wafer is cut by blade dicing, there is a possibility that cutting water may be scattered at the microstructure of the MEMS devices, causing damage to the microstructure. To cope with this problem, there has been proposed a method of dividing a MEMS wafer by attaching a protective tape to the front side of the MEMS wafer and next applying a laser beam to the MEMS wafer from the back side thereof (see Japanese Patent Laid-Open No. 2006-140341, for example).

In the case of cutting a wafer having a plurality of solid-state imaging devices such as CMOS (Complementary Metal Oxide Semiconductor) devices formed on the front side thereof by blade dicing, there is a possibility that a cutting waste or the like may stick to the front side of each device to cause a device failure. To cope with this problem, a cutting method using a protective tape attached to the front side of such a CMOS wafer is also adopted.

SUMMARY OF THE INVENTION

However, in the case that the protective tape is attached to the front side of the MEMS wafer where the MEMS devices are formed, there arises a problem such that the device structure of MEMS may be damaged by the adhesive force of an adhesive layer formed on the protective tape in peeling the protective tape from the MEMS wafer. Further, also in peeling the protective tape from the CMOS wafer, there arises a problem such that the adhesive layer may adhere to the solid-state imaging devices to cause a device failure.

It is therefore an object of the present invention to provide a wafer processing method which can divide a wafer into individual device chips without causing damage or contamination to the front side of the wafer.

In accordance with an aspect of the present invention, there is provided a wafer processing method for processing a wafer having a device area where a plurality of devices are respectively formed in a plurality of regions partitioned by a plurality of crossing division lines and a peripheral marginal area surrounding the device area, which are formed on the front side of the wafer the wafer processing method including a tape attaching step of attaching a ring adhesive tape having an annular adhesive layer in only a peripheral area thereof to the front side of the wafer in the condition where the front side of the wafer is fully covered with the ring adhesive tape and the annular adhesive layer is positioned so as to correspond to the peripheral marginal area of the wafer; a modified layer forming step of holding the wafer on a holding table in the condition where the ring adhesive tape attached to the front side of the wafer comes into contact with the holding table and next applying a laser beam having a transmission wavelength to the wafer from the back side of the wafer along the division lines to thereby form a plurality of modified layers inside the wafer along the division lines after performing the tape attaching step; a ring adhesive tape peeling step of attaching a protective tape to the back side of the wafer and peeling the ring adhesive tape from the front side of the wafer after performing the modified layer forming step; and a dividing step of applying an external force to the wafer to divide the wafer along the division lines where the modified layers are respectively formed as division start points, thereby obtaining a plurality of individual device chips after performing the ring adhesive tape peeling step.

With this configuration, the device area where the plural devices are formed is protected by the ring adhesive tape, so that the modified layers can be formed inside the wafer without damage to the device area. The annular adhesive layer of the ring adhesive tape is positioned so as to correspond to only the peripheral marginal area formed on the front side of the wafer, so that the annular adhesive layer does not adhere to the device area formed on the front side of the wafer. Accordingly, in peeling the ring adhesive tape from the front side of the wafer, there is no possibility that the device area may be damaged or contaminated by the annular adhesive layer.

Preferably, the wafer processing method of the present invention further includes a grinding and polishing step of holding the wafer on a second holding table in the condition where the ring adhesive tape attached to the front side of the wafer comes into contact with the second holding table, next grinding the back side of the wafer by using grinding means, and next polishing the back side of the wafer by using polishing means after performing the tape attaching step and before performing the modified layer forming step.

Preferably, the protective tape attached to the back side of the wafer in the ring adhesive tape peeling step is formed from an expandable member; and the wafer processing method further includes an expanding step of expanding the protective tape to increase the spacing of the device chips after performing the dividing step.

According to the present invention, the ring adhesive tape is attached to the front side of the wafer in the condition where the annular adhesive layer formed in the peripheral area of the ring adhesive tape is positioned so as to correspond to the peripheral marginal area of the wafer, so that it is possible to prevent damage or contamination to the device area of the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

A wafer processing method according to a first preferred embodiment of the present invention will now be described with reference to the attached drawings. Division of a wafer by the use of the wafer processing method according to the first preferred embodiment is attained by a tape attaching step, a grinding and polishing step using a grinding apparatus and a polishing apparatus, a modified layer forming step using a laser processing apparatus, a ring adhesive tape peeling step using a tape attaching/peeling apparatus, and a dividing step using an expanding apparatus. In the tape attaching step, a ring adhesive tape is attached to the front side of a wafer on which a plurality of devices are formed. The ring adhesive tape has an adhesive layer in only a peripheral area thereof, so that the adhesive layer is prevented from sticking to a device area formed as a central area of the wafer.

In the grinding and polishing step, the back side of the wafer is ground to reduce the thickness of the wafer to a predetermined thickness and next polished. In the modified layer forming step, a laser beam is applied to the wafer from the back side thereof to continuously form a modified layer inside the wafer along each division line. In the ring adhesive tape peeling step, a protective tape is attached to the back side of the wafer, and the ring adhesive tape is peeled from the front side of the wafer. In the dividing step, an external force is applied to the wafer to thereby divide the wafer along the modified layers as division start points to obtain individual device chips. The wafer processing method according to this preferred embodiment will now be described in more detail.

Figure 1:
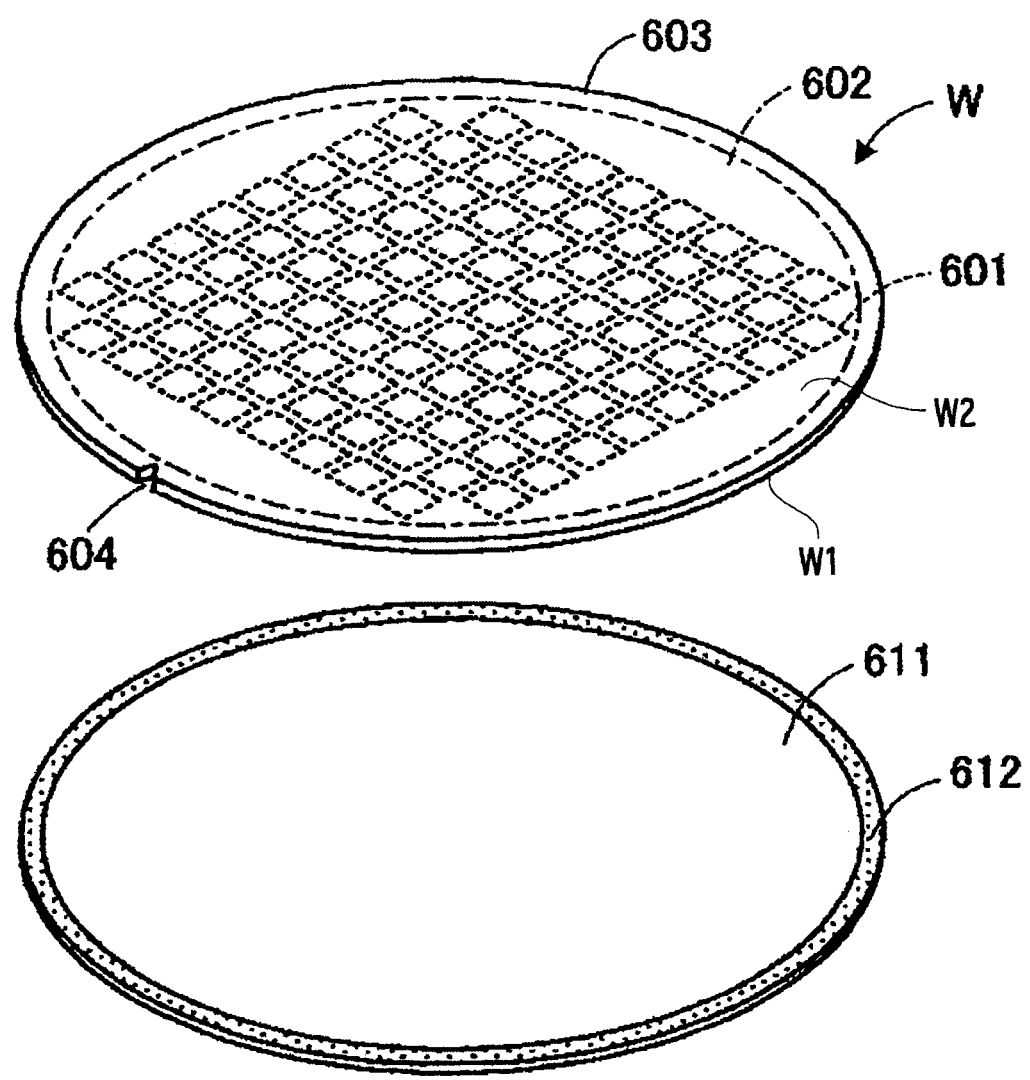
FIG. 1 is a perspective view of a ring adhesive tape and a wafer.

The ring adhesive tape to be attached to the wafer in the tape attaching step will now be described with reference to FIG. 1. Attachment of the ring adhesive tape in the tape attaching step may be made manually by an operator or by using a tape attaching apparatus (not shown). As shown in FIG. 1, a plurality of crossing division lines are formed on a front side W1 of a substantially circular wafer W to thereby partition a plurality of rectangular regions where a plurality of devices 601 are respectively formed. These devices 601 are formed in a central area of the wafer W. The front side W1 of the wafer W is composed of a device area 602 where the plural devices 601 are formed and a peripheral marginal area 603 surrounding the device area 602. The outer circumference of the wafer W is formed with a notch 604 for indicating the crystal orientation of the wafer W.

In this preferred embodiment, the wafer W is a MEMS wafer having MEMS devices formed on the front side thereof. However, the wafer W is not limited to such a MEMS wafer, but may be a CMOS wafer having CMOS devices as solid-state imaging devices formed on the front side thereof. Further, the wafer W may be a silicon wafer configured by forming devices such as ICs and LSIs on a silicon substrate or may be an optical device wafer configured by forming optical devices such as LEDs (Light Emitting Diode) on an inorganic material substrate of ceramic, glass, or sapphire.

A ring adhesive tape having a circular shape and has an outer diameter substantially equal to that of the wafer W. The ring adhesive tape 611 is formed of polyolefin or the like. An annular adhesive layer 612 is formed on one side of the ring adhesive tape 611 in its peripheral area along the outer circumference. The annular adhesive layer 612 is formed by applying an acrylic resin containing a UV (ultraviolet) curable component. The annular adhesive layer 612 has a width falling within the peripheral marginal area 603 of the wafer W to which the ring adhesive tape 611 is to be attached. Accordingly, the ring adhesive tape 611 is attached to the front side W1 of the wafer W in such a manner that the annular adhesive layer 612 adheres to only the peripheral marginal area 603. That is, the device area 602 is protected by the ring adhesive tape 611 without the adhesion of the annular adhesive layer 612 to the device area 602. After performing the tape attaching step to attach the ring adhesive tape 611 to the front side W1 of the wafer W as mentioned above, the wafer W is transported to a grinding apparatus 100 shown in FIG. 2.

While the ring adhesive tape 611 has substantially the same size as that of the wafer W in this preferred embodiment, the configuration of the ring adhesive tape 611 is not limited to the above configuration. That is, it is appropriate that the ring adhesive tape 611 has a size enough to entirely cover the front side W1 of the wafer W and that the annular adhesive layer 612 is formed so as to adhere to only the peripheral marginal area 603 of the wafer W. Further, the annular adhesive layer 612 may be formed of any liquid resin curable by an external stimulus. For example, a thermosetting resin curable by heat may be used. The external stimulus mentioned above includes not only ultraviolet radiation and heat, but also radiation, electron beam, electric field, and chemical reaction, for example.

A grinding apparatus 100 for reducing the thickness of the wafer and a polishing apparatus (not shown) for polishing the wafer in the grinding and polishing step will now be described with reference to FIG. 2. The polishing apparatus is substantially similar in configuration to the grinding apparatus 100, and only a difference will be hereinafter described. The grinding apparatus and the polishing apparatus usable in the present invention are not limited in configuration to those in this preferred embodiment, but it is essential that the grinding apparatus has any configuration capable of reducing the thickness of the wafer and that the polishing apparatus has any configuration capable of polishing the wafer.

Figure 2:
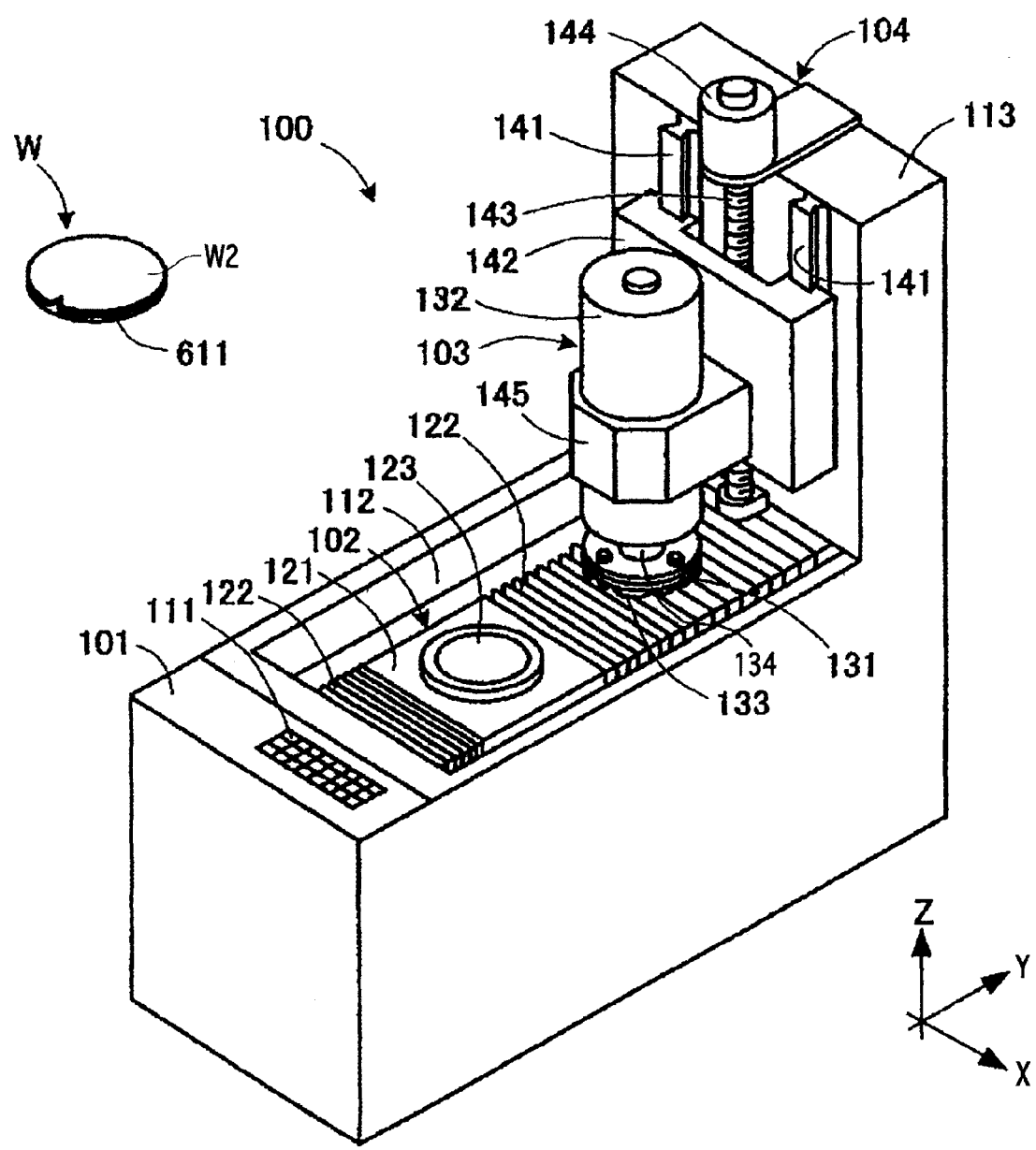
FIG. 2 is a perspective view of a grinding apparatus.

As shown in FIG. 2, the grinding apparatus 100 is so configured as to grind the wafer W by relatively rotating a chuck table 102 holding the wafer W thereon and a grinding wheel 131. The grinding apparatus 100 has a boxlike base 101. An operation panel 111 for inputting instructions from the operator to the grinding apparatus 100 is provided on the upper surface of the front end portion of the base 101. The upper surface of the base 101 at a portion on the rear side of the operation panel 111 is formed with a recess 112 extending in the Y direction. A column 113 for supporting a grinding unit 103 is formed at the rear end of the base 101 so as to vertically extend on the rear side of the recess 112.

The chuck table 102 is supported to a moving plate 121 so as to be movable in the Y direction and a pair of front and rear bellows-shaped waterproof covers 122 are connected to the front and rear ends of the moving plate 121. All of the chuck table 102, the moving plate 121, and the waterproof covers 122 are provided in the recess 112. A ball-screw type moving mechanism (not shown) for moving the chuck table 102 in the Y direction is provided below the waterproof covers 122. The chuck table 102 is reciprocatively movable in the Y direction between a loading position where the wafer W is loaded and a grinding position where the wafer W held on the chuck table 102 is opposed to the grinding unit 103.

The chuck table 102 has a circular shape, and it is rotatably provided on the upper surface of the moving plate 121. The upper surface of the chuck table 102 is formed as a holding surface 123 for holding the wafer W under suction. The holding surface 123 is formed of a porous ceramic material. The wafer W is held under suction on the holding surface 123 of the chuck table 102 in the condition where the ring adhesive tape 611 is attached to the front side W1 of the wafer W is oriented downward.

A grinding unit moving mechanism 104 for vertically moving the grinding unit 103 is provided on the front surface of the column 113. The grinding unit moving mechanism 104 has a pair of parallel guide rails 141 vertically extending in the Z direction and a motor-driven Z-axis table 142 slidably mounted on the guide rails 141 so as to be movable in the Z direction. A nut portion (not shown) is formed on the back surface of the Z-axis table 142, and a ball screw 143 is threadedly engaged with this nut portion. A pulse motor 144 is connected to one end of the ball screw 143. Accordingly, the ball screw 143 is rotatably driven by the pulse motor 144.

The grinding unit 103 is supported through a support member 145 to the front surface of the Z-axis table 142. The grinding unit 103 includes a cylindrical spindle housing 132, a spindle 134 rotatably accommodated in the spindle housing 132, and a grinding wheel 131 mounted to the lower end of the spindle 134. A plurality of abrasive members 133 are fixed to the lower surface of the grinding wheel 131. Each abrasive member 133 is formed from a diamond abrasive member configured by fixing diamond abrasive grains with a bond such as a metal bond and a resin bond. The abrasive members 133 are annularly arranged and they are rotated at high speeds about the Z axis by driving the spindle 134. The grinding surface (lower surface) of each abrasive member 133 is brought into contact with a back side W2 (upper surface) of the wafer W held on the chuck table 102 in the condition where both the grinding wheel 131 and the chuck table 102 are rotated in a mutually parallel condition, thereby grinding the back side W2 of the wafer W to reduce the thickness of the wafer W to a predetermined thickness.

Thereafter, the wafer W ground by the grinding apparatus 100 as mentioned above is transported to the polishing apparatus (not shown). This polishing apparatus is so configured as to perform dry polish or CMP (Chemical Mechanical Polishing), for example. The dry polish may be performed by using a polishing tool provided by a felt abrasive, which is obtained by dispersing abrasive grains in a felt and fixing the abrasive grains with a suitable bond. This polishing apparatus functions to polish the back side W2 of the wafer W ground above, thereby suppressing scattering of a laser beam applied to the wafer W from the back side thereof in the next modified layer forming step.

Figure 3:
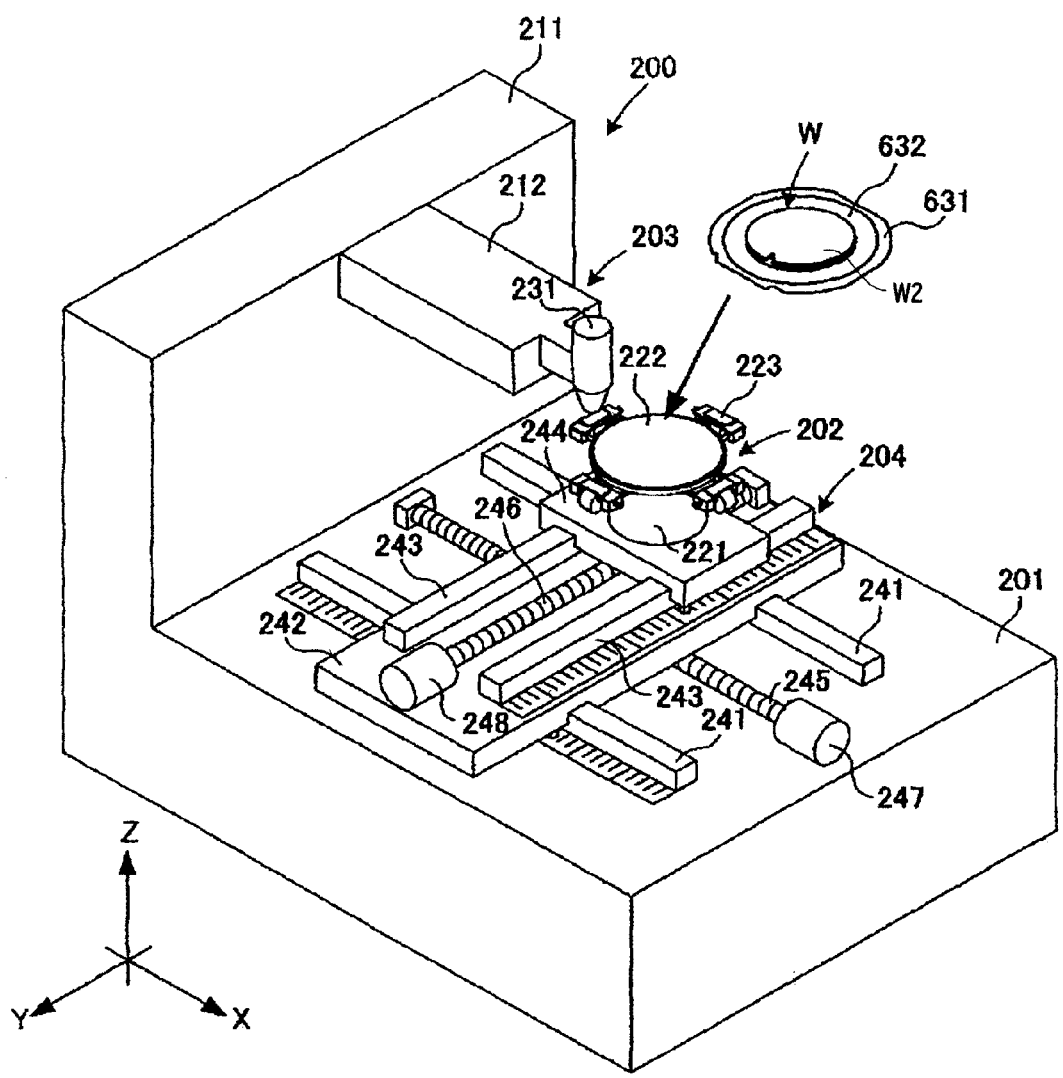
FIG. 3 is a perspective view of a laser processing apparatus.

After polishing the back side W2 of the wafer W as mentioned above, the wafer W is attached to a support tape (dicing tape) 632 whose peripheral portion is preliminarily attached to a ring frame 631 in the condition where the ring adhesive tape 611 attached to the front side W1 of the wafer W is oriented downward (see FIG. 3). The wafer W attached to the support tape 632 is transported to a laser processing apparatus 200 shown in FIG. 3. The laser processing apparatus 200 for forming the modified layers inside the wafer W in the modified layer forming step will now be described with reference to FIG. 3. The laser processing apparatus usable in the present invention is not limited to the configuration shown in FIG. 3, but it is appropriate that the laser processing apparatus has any configuration capable of forming the modified layers inside the wafer.

As shown in FIG. 3, the laser processing apparatus 200 is configured so as to process the wafer W by relatively moving a laser processing unit 203 for applying a laser beam to the wafer W and a chuck table 202 holding the wafer W. The laser processing apparatus 200 has a boxlike bed portion 201. There is provided on the upper surface of the bed portion 201 a chuck table moving mechanism 204 for feeding the chuck table 202 in the X direction and also indexing the chuck table 202 in the Y direction. A column portion 211 is formed on the upper surface of the bed portion 201 at its rear end so as to vertically extend on the rear side of the chuck table moving mechanism 204. An arm portion 212 projects from the front surface of the column portion 211, and the laser processing unit 203 is supported to the arm portion 212 so as to be opposed to the chuck table 202.

The chuck table moving mechanism 204 has a pair of parallel guide rails 241 provided on the upper surface of the bed portion 201 so as to extend in the X direction and a motor-driven X-axis table 242 slidably mounted on the guide rails 241 so as to be movable in the X direction. The chuck table moving mechanism 204 further has a pair of parallel guide rails 243 provided on the upper surface of the X-axis table 242 so as to extend in the Y direction and a motor-driven Y-axis table 244 slidably mounted on the guide rails 243.

The chuck table 202 is provided on the upper surface of the Y-axis table 244. Although not shown, a nut portion is formed on the lower surface of the X-axis table 242, and a nut portion is formed on the lower surface of the Y-axis table 244. A ball screw 245 is threadedly engaged with the nut portion of the X-axis table 242, and a ball screw 246 is threadedly engaged with the nut portion of the Y-axis table 244. A pulse motor 247 is connected to one end of the ball screw 245, and a pulse motor 248 is connected to one end of the ball screw 246. Accordingly, the X-axis table 242 is moved along the guide rails 241 in the X direction by operating the pulse motor 247, and the Y-axis table 244 is moved along the guide rails 243 in the Y direction by operating the pulse motor 248, so that the chuck table 202 is moved in the X direction and the Y direction.

The chuck table 202 has a circular shape, and it is rotatably supported through a θ table 221 to the upper surface of the Y-axis table 244. The upper surface of the chuck table 202 is formed as a holding surface 222 for holding the wafer W under suction. The holding surface 222 is formed of a porous ceramic material. For clamps 223 are provided at equal intervals around the chuck table 202 in such a manner that each clamp 223 is supported through a pair of radially extending support arms. These four clamps 223 are driven by an actuator to hold the ring frame 631 supporting the wafer W through the support tape 632.

The laser processing unit 203 has a laser head 231 provided at the front end of the arm portion 212. Although not shown, an optical system of the laser processing unit 203 is provided in the arm portion 212 and the laser head 231. The laser head 231 includes a focusing lens for focusing a laser beam oscillated from an oscillator (not shown) to laser-process the wafer W held on the chuck table 202. The laser beam has a transmission wavelength to the wafer W, and the focal point of the laser beam is set inside the wafer W by the optical system.

By the operation of the laser beam applied from the laser head 231 to the wafer W, a modified layer 641 (see FIG. 5C) as a division start point is formed inside the wafer W along each division line. Each modified layer 641 means a region different from its ambient region in density, refractive index, mechanical strength, or any other physical properties in the wafer W due to the application of the laser beam, causing a reduction in strength as compared with the ambient region. Examples of each modified layer 641 include a melted and rehardened region, cracked region, breakdown region, and refractive index changed region. These regions may be present in a mixed condition.

In performing the modified layer forming step using the laser processing apparatus 200, the Y-axis table 244 is moved to align a laser beam outlet of the laser head 231 to a predetermined one of the division lines of the wafer W. Thereafter, the laser beam is applied from the laser head 231 to the wafer W and the X-axis table 242 is moved to thereby form the modified layer 641 inside the wafer W along the predetermined division line. This laser processing is similarly performed along all of the other division lines to form a plurality of modified layers 641 along all of the other division lines.

Thereafter, the wafer W is transported to a tape attaching/peeling apparatus (not shown) for use in performing the ring adhesive tape peeling step.

Figure 5A:
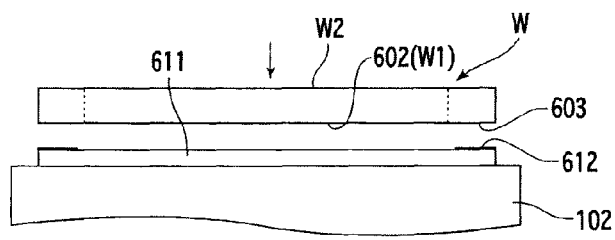
FIGS. 5A to 5E are sectional side views illustrating the flow of a wafer processing method according to a first preferred embodiment of the present invention.
Figure 5B:
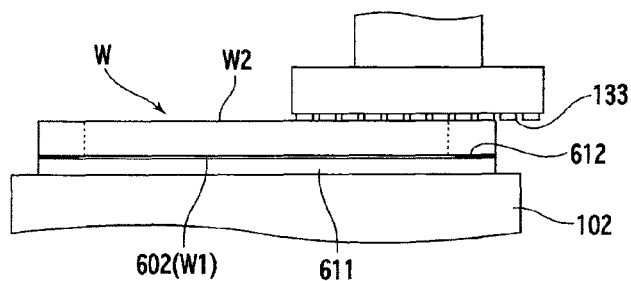
Figure 5C:
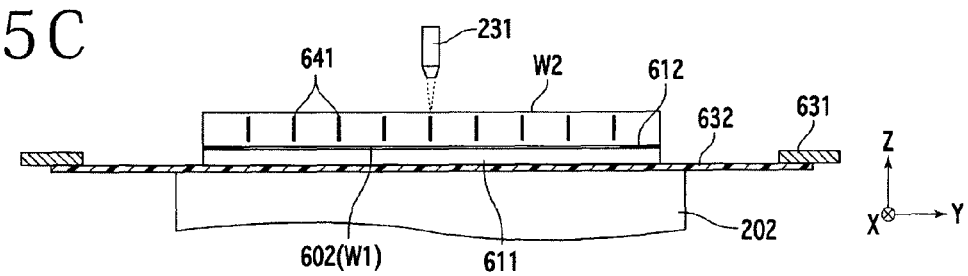
Figure 5D:
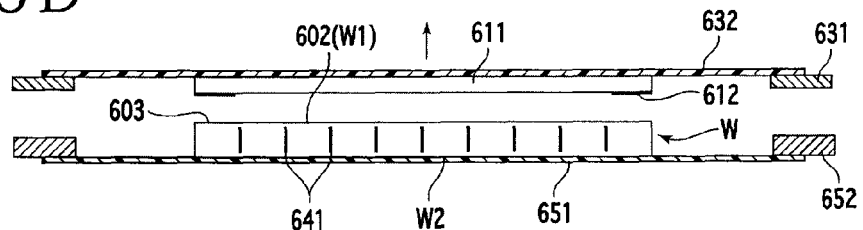

In performing the ring adhesive tape peeling step using the tape attaching/peeling apparatus, a protective tape 651 having expansibility is attached to the back side W2 of the wafer W, and the ring adhesive tape 611 is peeled together with the support tape 632 from the front side W1 of the wafer W (see FIG. 5D). By such a tape attaching/peeling operation, the front side W1 of the wafer W is exposed and the back side W2 of the wafer W to be held in the next dividing step is protected by the protective tape 651.

The annular adhesive layer 612 of the ring adhesive tape 611 is attached to only the peripheral marginal area 603 of the wafer W. Accordingly, in peeling the ring adhesive tape 611 from the front side W1 of the wafer W, there is no possibility that the device area 602 may be damaged or contaminated by the annular adhesive layer 612. While the tape attaching operation for attaching the protective tape 651 to the back side W2 of the wafer W and the tape peeling operation for peeling the ring adhesive tape 611 from the front side W1 of the wafer W are performed by the tape attaching/peeling apparatus in this preferred embodiment, the tape attaching operation and the tape peeling operation may be separately performed by individual apparatuses. After performing the ring adhesive tape peeling step as mentioned above, the wafer W is transported to an expanding apparatus 300 shown in FIG. 4 in the condition where the front side W1 where the devices 601 are formed is oriented upward.

The expanding apparatus 300 for expanding the protective tape 651 to thereby divide the wafer W in the dividing step will now be described with reference to FIG. 4. The expanding apparatus usable in the present invention is not limited in configuration to that shown in FIG. 4, but it is essential that the expanding apparatus has any configuration capable of dividing the wafer along the modified layers as division start points.

Figure 4:
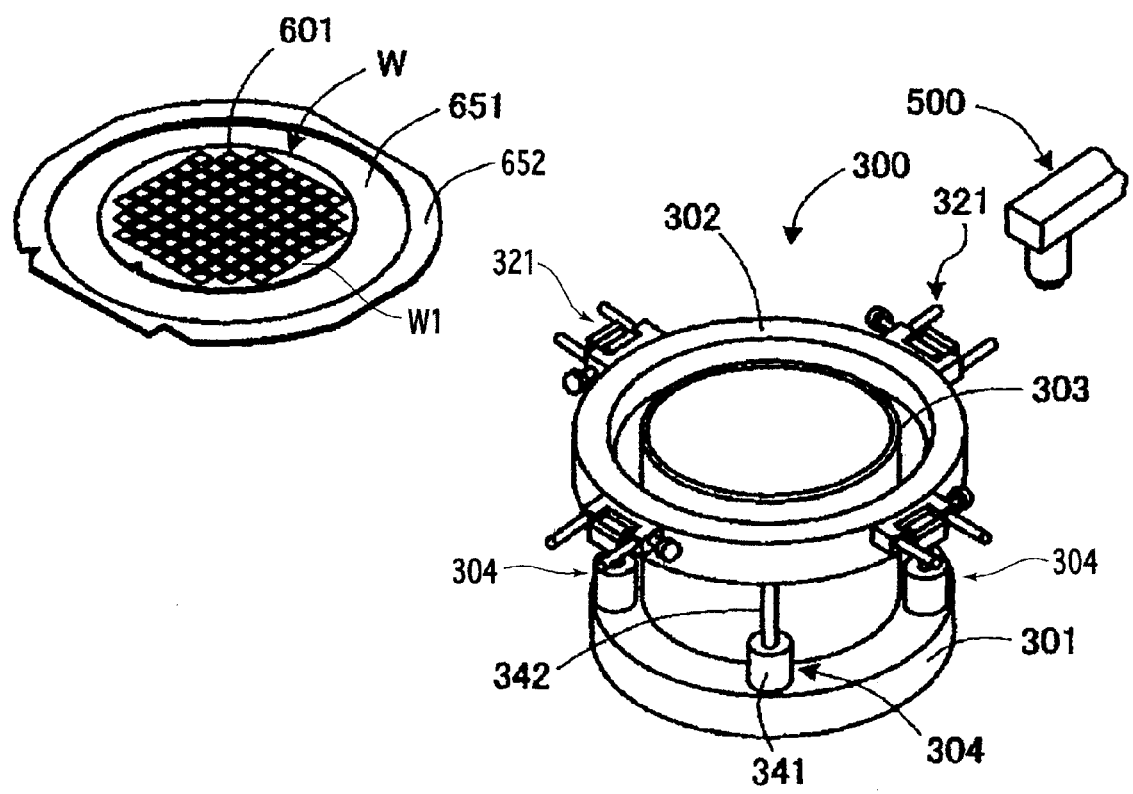
FIG. 4 is a perspective view of an expanding apparatus.

As shown in FIG. 4, the protective tape 651 is preliminarily supported at its peripheral portion to a ring frame 652. The expanding apparatus 300 is so configured as to vertically move an annular table 302 holding the ring frame 631 relative to an expansion drum 303, thereby expanding the protective tape 651. The expanding apparatus 300 has a substantially circular base 301, and the expansion drum 303 having a cylindrical shape is provided on the upper surface of the base 301 at its central portion. Four moving mechanisms 304 are provided on the upper surface of the base 301 so as to surround the cylindrical surface of the expansion drum 303.

Each moving mechanism 304 is composed of an air cylinder 341 and a piston rod 342 extending upward from the air cylinder 341. The annular table 302 is connected to the upper end of each piston rod 342. When the ring frame 652 is placed on the annular table 302, the wafer W is positioned just above the expansion drum 303. Four clamps 321 for clamping the ring frame 652 are provided at equal intervals on the outer circumference of the annular table 302. Further, a pickup collet 500 for picking up each device chip under suction after dividing the wafer W is located above the expansion drum 303.

The outer diameter of the expansion drum 303 is smaller than the inner diameter of the ring frame 652, and the inner diameter of the expansion drum 303 is larger than the outer diameter of the wafer W. Accordingly, the upper end of the expansion drum 303 is positioned between the outer circumference of the wafer W and the inner circumference of the ring frame 652. Since the protective tape 651 is attached to the back side W2 of the wafer W, the upper end of the expansion drum 303 is adapted to come into abutment against the protective tape 651 in an annular area formed between the outer circumference of the wafer W and the inner circumference of the ring frame 652.

In performing the dividing step using this expanding apparatus 300, the moving mechanisms 304 are operated to lower the annular table 302 holding the ring frame 652. As a result, the expansion drum 303 is relatively raised with respect to the annular table 302, so that the protective tape 651 is pushed up by the upper end of the expansion drum 303 and therefore radially expanded. When the protective tape 651 is expanded in this manner, an external force is applied to the modified layers 641 formed inside the wafer W. As a result, the wafer W is divided along the division lines where the modified layers 641 are formed as the division start points, thereby obtaining a plurality of individual device chips 661 (see FIG. 5E). Thereafter, the protective tape 651 is further expanded to increase the spacing of the device chips 661 divided from each other. Each device chip 661 is then peeled from the protective tape 651 and picked up under suction by the pickup collet 500.

The flow of the wafer processing method according to the first preferred embodiment will now be described with reference to FIGS. 5A to 5E. The steps shown in FIGS. 5A to 5E are merely illustrative and the steps of the wafer processing method according to the present invention are not limited to those shown in FIGS. 5A to 5E. First, the tape attaching step shown in FIG. 5A is performed. As shown in FIG. 5A, the ring adhesive tape 611 is attached to the front side W1 of the wafer W where the device area 602 is formed. The annular adhesive layer 612 is preliminarily formed on the ring adhesive tape 611 in its peripheral area corresponding to the peripheral marginal area 603 of the wafer W. Accordingly, the annular adhesive layer 612 adheres to only the peripheral marginal area 603 of the wafer W, so that no adhesive sticks to the device area 602 of the wafer W. Further, the device area 602 of the wafer W is protected by the ring adhesive tape 611 in its central area where the annular adhesive layer 612 is not formed. This tape attaching step may be performed manually by the operator or by using a tape attaching apparatus (not shown).

The grinding and polishing step shown in FIG. 5B is next performed. As shown in FIG. 5B, the ring adhesive tape 611 attached to the front side W1 of the wafer W is held on the chuck table 102. The abrasive members 133 are rotated and brought into contact with the back side W2 of the wafer W to thereby grind the back side W2 of the wafer W. After the thickness of the wafer W is reduced to a predetermined thickness by this grinding operation, the back side W2 of the wafer W is polished by using a polishing apparatus (not shown). By grinding the back side W2 of the wafer W to reduce the thickness of the wafer W and next polishing the back side W2 of the wafer W, the wafer W is processed to become suitable for the formation of the modified layers 641. Thereafter, the ring adhesive tape 611 attached to the front side W1 of the wafer W is attached to the support tape 632 supported to the ring frame 631 (see FIG. 5C).

The modified layer forming step shown in FIG. 5C is next performed. As shown in FIG. 5C, the support tape 632 attached through the ring adhesive tape 611 to the front side W1 of the wafer W is held on the chuck table 202. Further, the laser beam outlet of the laser head 231 is aligned to a predetermined one of the division lines of the wafer W, and the focal point of the laser beam is set inside the wafer W. Thereafter, the laser beam is applied from the laser beam outlet of the laser head 231, and the chuck table 202 holding the wafer W is moved in the X direction to thereby form the modified layer 641 having a predetermined thickness inside the wafer W along the predetermined division line. Since the back side W2 of the wafer W is polished, scattering of the laser beam applied to the back side W2 of the wafer W can be suppressed. Thereafter, the chuck table 202 is indexed in the Y direction to similarly form the modified layers 641 inside the wafer W along all of the other division lines extending in a first direction. Thereafter, the chuck table 202 is rotated 90° to similarly form the modified layers 641 inside the wafer W along all of the division lines extending in a second direction perpendicular to the first direction.

The ring adhesive tape peeling step shown in FIG. 5D is next performed. As shown in FIG. 5D, the protective tape 651 supported to the ring frame 652 is attached to the back side W2 of the wafer W, and the ring adhesive tape 611 is peeled together with the support tape 632 from the front side W1 of the wafer W. Since the annular adhesive layer 612 of the ring adhesive tape 611 does not adhere to the device area 602 on the front side W1 of the wafer W, there is no possibility that the devices 601 may be damaged by the adhesive force of the annular adhesive layer 612 or the adhesive may be left on the devices 601.

Figure 5E:
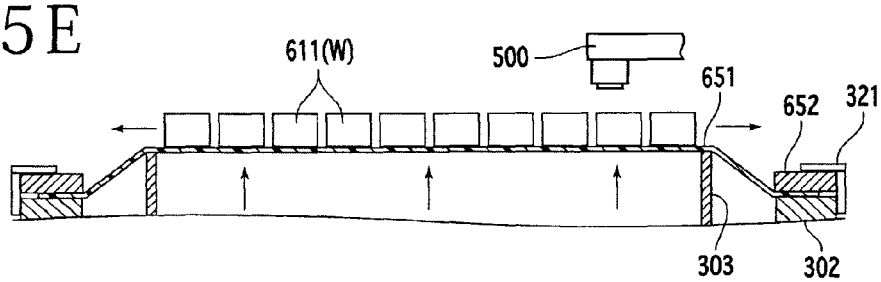

The dividing step shown in FIG. 5E is next performed. As shown in FIG. 5E, the ring frame 652 supporting the protective tape 651 is held on the annular table 302 and fixed by the clamps 321. Thereafter, the expansion drum 303 is relatively raised with respect to the annular table 302 to thereby expand the protective tape 651, so that an external force is applied to the modified layers 641 formed inside the wafer W. As a result, the wafer W is divided along the modified layers 641 as the division start points to obtain the individual device chips 661. After thus dividing the wafer W, the protective tape 651 is further expanded to increase the spacing of the device chips 661 in order to facilitate the peeling of each device chip 661 from the protective tape 651. In such a condition where the spacing of the device chips 661 has been increased, each device chip 661 is peeled from the protective tape 651 and picked up under suction by the pickup collet 500.

According to the first preferred embodiment of the present invention as mentioned above, the device area 602 is protected by the ring adhesive tape 611. Accordingly, the modified layers 641 can be formed inside the wafer W without damage to the device area 602. That is, the annular adhesive layer 612 of the ring adhesive tape 611 is positioned so as to correspond to only the peripheral marginal area 603 formed on the front side W1 of the wafer W. Accordingly, the annular adhesive layer 612 does not adhere to the device area 602 formed on the front side W1 of the wafer W. As a result, in peeling the ring adhesive tape 611 from the front side W1 of the wafer W, there is no possibility that the device structure of MEMS may be damaged by the adhesive force of the annular adhesive layer 612.

A wafer processing method according to a second preferred embodiment of the present invention will now be described. Division of a wafer by the use of the wafer processing method according to the second preferred embodiment is attained by a tape attaching step, a grinding and polishing step using a grinding apparatus and a polishing apparatus, a modified layer forming step using a laser processing apparatus, a ring adhesive tape peeling step using a tape attaching/peeling apparatus, a dividing step using a breaking apparatus, and an expanding step using an expanding apparatus. The second preferred embodiment is different from the first preferred embodiment in the point that the dividing step is performed by using a breaking apparatus and the wafer divided by the dividing step is subjected to the expanding step.

The flow of the wafer processing method according to the second preferred embodiment will now be described with reference to FIGS. 6A to 6F. The steps shown in FIGS. 6A to 6F are merely illustrative and the steps of the wafer processing method according to the present invention are not limited to those shown in FIGS. 6A to 6F. The steps shown in FIGS. 6A to 6D are the same as the steps shown in FIGS. 5A to 5D, respectively. Accordingly, the description of the steps shown in FIGS. 6A to 6D will be omitted herein. Further, since the dividing step using a breaking apparatus is performed, the second preferred embodiment is not suitable for the division of a MEMS wafer that is more susceptible to damage. Accordingly, a CMOS wafer is used as the wafer W in place of the MEMS wafer in the second preferred embodiment.

Figure 6A:
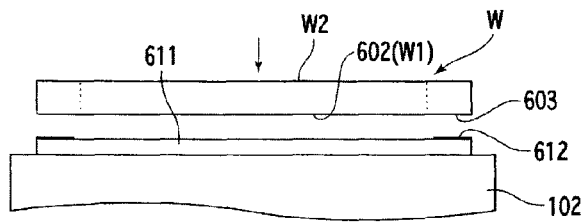
FIGS. 6A to 6F are sectional side views illustrating the flow of a wafer processing method according to a second preferred embodiment of the present invention.
Figure 6B:
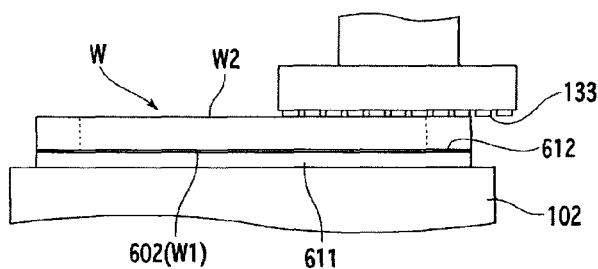
Figure 6C:
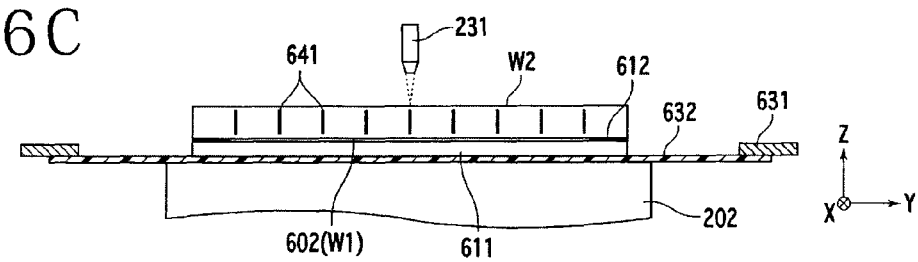
Figure 6D:
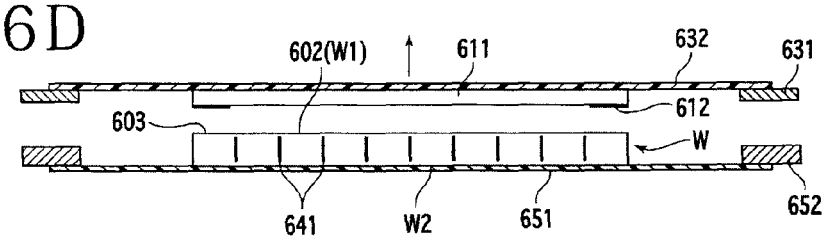
Figure 6E:
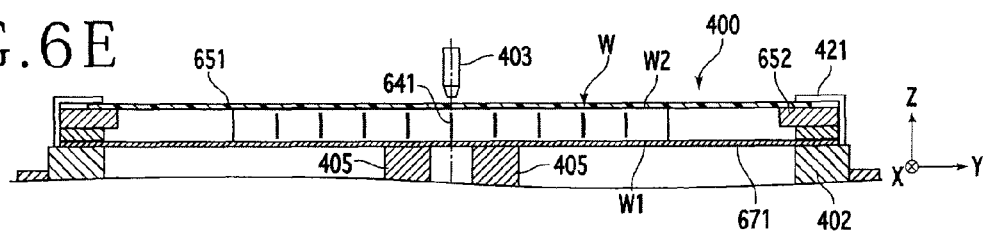

As shown in FIG. 6E, the wafer W attached to the protective tape 651 is transported to a breaking apparatus 400 in the condition where the front side W1 on which the devices 601 are formed is oriented downward. The breaking apparatus 400 is so configured as to press a push blade 403 against the wafer W held on an annular table 402, thereby dividing the wafer W along each modified layer 641 as a division start point. The annular table 402 is movable in the X direction by a moving mechanism (not shown) and also rotatable about the Z axis by a rotating mechanism (not shown). The ring frame 652 supporting the wafer W through the protective tape 651 is held on the annular table 402 and fixed by four clamps 421 provided on the annular table 402.

A pair of parallel support beds 405 for supporting a support plate 671 are provided inside the annular table 402. The support plate 671 functions to protect the front side W1 of the wafer W. The outer circumferential portion of the support plate 671 is fixed to the annular table 402. The pair of parallel support beds 405 extends in the Y direction, and imaging means (not shown) is provided between the pair of parallel support beds 405. This imaging means functions to image the front side W1 of the wafer W through the support plate 671 from between the pair of parallel support beds 405. The push blade 403 is located above the pair of parallel support beds 405 and functions to push down the wafer W and the support plate 671. The push blade 403 extends in the Y direction, and it is vertically movable by a pressing mechanism (not shown).

The dividing step using the breaking apparatus 400 mentioned above is performed in the following manner. First, the wafer W is placed through the support plate 671 on the pair of parallel support beds 405, and the ring frame 652 supporting the wafer W through the protective tape 651 is fixedly held on the annular table 402 by the clamps 421. The support plate 671 is formed of a material transmitting visible light, so that the front side W1 of the wafer W is imaged through the support plate 671 by the imaging means located below the support plate 671. A predetermined one of the division lines formed on the front side W1 of the wafer W is positioned between the pair of parallel support beds 405 and directly below the push blade 403 according to an image obtained by the imaging means. Thereafter, the push blade 403 is lowered to push down the wafer W along this predetermined division line where the modified layer 641 is formed as a division start point, thereby dividing the wafer W along this predetermined division line. Thereafter, this dividing operation is similarly performed along all of the other division lines of the wafer W by moving the annular table 402 in the X direction and rotating the annular table 402 about the Z axis. As a result, the wafer W is divided into the individual device chips 661.

Figure 6F:
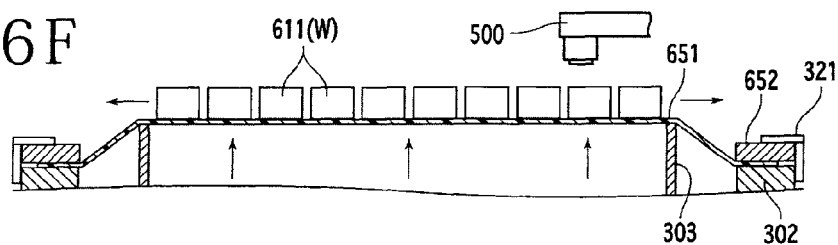

The expanding step shown in FIG. 6F is next performed by using the expanding apparatus 300 shown in FIG. 4. As shown in FIG. 6F, the ring frame 652 is fixedly held on the annular table 302 by the clamps 321 in the condition where the front side W1 of the wafer W is oriented upward. Thereafter, the expansion drum 303 is relatively raised with respect to the annular table 302 to thereby expand the protective tape 651. As a result, the spacing of the individual device chips 661 is increased. In such a condition where the spacing of the device chips 661 has been increased, each device chip 661 is peeled from the protective tape 651 and picked up under suction by the pickup collet 500.

According to the second preferred embodiment of the present invention as mentioned above, the modified layers 641 can be formed inside the wafer W without damage to the device area 602 as in the first preferred embodiment. Further, the annular adhesive layer 612 of the ring adhesive tape 611 is positioned so as to correspond to only the peripheral marginal area 603 formed on the front side W1 of the wafer W. Accordingly, the annular adhesive layer 612 does not adhere to the device area 602 formed on the front side W1 of the wafer W. As a result, in peeling the ring adhesive tape 611 from the front side W1 of the wafer W, there is no possibility that the adhesive of the annular adhesive layer 612 may stick to the solid-state imaging devices to cause a device failure.

The present invention is not limited to the above preferred embodiments, but various modifications may be made. That is, the configuration of the present invention is not limited to the configuration shown in the attached drawings, such as size and shape, but the configuration may be suitably modified within the scope where the effect of the present invention is exhibited. Further, various modifications may be made without departing from the scope of the object of the present invention.

For example, while the grinding and polishing step is performed in the first and second preferred embodiments, this step is not essential in the present invention. That is, the grinding and polishing step may be omitted provided that the modified layers 641 can be formed inside the wafer W. Further, only any one of the grinding step and the polishing step in the grinding and polishing step may be performed.

In the first preferred embodiment, the modified layer forming step is performed by the laser processing apparatus, the grinding and polishing step is performed by the grinding apparatus and the polishing apparatus, the ring adhesive tape peeling step is performed by the tape attaching/peeling apparatus, and the dividing step is performed by the expanding apparatus. However, some or all of these steps may be performed by a single apparatus. Similarly, in the second preferred embodiment, the modified layer forming step is performed by the laser processing apparatus, the grinding and polishing step is performed by the grinding apparatus and the polishing apparatus, the ring adhesive tape peeling step is performed by the tape attaching/peeling apparatus, the dividing step is performed by the breaking apparatus, and the expanding step is performed by the expanding apparatus. However, some or all of these steps may be performed by a single apparatus.

As described above, the present invention can exhibit the effect that the wafer can be divided into the individual device chips without causing damage or contamination to the front side of the wafer. The present invention is especially useful as a wafer processing method for dividing a MEMS wafer or a CMOS wafer.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for processing a wafer having a device area where a plurality of devices are respectively formed in a plurality of regions partitioned by a plurality of crossing division lines, and a peripheral marginal area surrounding said device area which are formed on a front side of said wafer, said wafer processing method comprising:
   a tape attaching step of attaching a ring an adhesive tape having an annular adhesive layer only in a peripheral area thereof to the front side of said wafer in the condition where the front side of said wafer is fully covered with said adhesive tape and said annular adhesive layer is positioned so as to correspond to said peripheral marginal area of said wafer, without said annular adhesive layer making contact with said device area;
   a modified layer forming step of holding said wafer on a holding table in the condition where said adhesive tape attached to the front side of said wafer comes into contact with said holding table and next applying a laser beam having a transmission wavelength to said wafer from a back side of said wafer along said division lines to thereby form a plurality of modified layers inside said wafer along said division lines after performing said tape attaching step;
   an adhesive tape peeling step of attaching a protective tape to the back side of said wafer and peeling said ring adhesive tape from the front side of said wafer after performing said modified layer forming step; and
   a dividing step of applying an external force to said wafer to divide said wafer along said division lines where said modified layers are respectively formed as division start points, thereby obtaining a plurality of individual device chips after performing said adhesive tape peeling step.

2. The wafer processing method according to claim 1, further comprising a grinding and polishing step of holding said wafer on a second holding table in the condition where said adhesive tape attached to the front side of said wafer comes into contact with said second holding table, next grinding the back side of said wafer by using grinding means, and next polishing the back side of said wafer by using polishing means after performing said tape attaching step and before performing said modified layer forming step.

3. The wafer processing method according to claim 1, wherein said protective tape attached to the back side of said wafer in said ring adhesive tape peeling step is formed from an expandable member; and
   said wafer processing method further comprises an expanding step of expanding said protective tape to increase the spacing of said device chips after performing said dividing step.

* * * * *